United States Patent [19]

Kukanskis

[11] Patent Number: 5,376,189
[45] Date of Patent: Dec. 27, 1994

[54] COMPOSITION AND PROCESS FOR TREATMENT OF METALLIC SURFACES

[75] Inventor: Peter E. Kukanskis, Woodbury, Conn.

[73] Assignee: MacDermid, Incorporated, Waterbury, Conn.

[21] Appl. No.: 148,551

[22] Filed: Nov. 8, 1993

[51] Int. Cl.$^5$ ............................................. C23F 11/14
[52] U.S. Cl. .................................. 148/269; 148/274; 106/14.16
[58] Field of Search ............................... 148/274, 269; 106/14.13, 14.16

[56] References Cited

U.S. PATENT DOCUMENTS

| | | | |
|---|---|---|---|
| 3,895,170 | 7/1975 | Tanaka | 148/274 |
| 4,395,294 | 7/1983 | Hobbins | 148/6.14 R |
| 4,428,987 | 1/1984 | Bell | 148/274 |
| 4,622,097 | 11/1986 | Tsukagoshi | 156/644 |
| 5,173,130 | 12/1992 | Kinoshita | 148/268 |

FOREIGN PATENT DOCUMENTS

0428260A2  5/1991  European Pat. Off. .

*Primary Examiner*—Sam Silverberger
*Attorney, Agent, or Firm*—John L. Cordani

[57] ABSTRACT

Disclosed is a composition and process for the treatment of metallic surfaces, which comprises treating said surface with an aqueous solution comprising a benzimidazole compound which has at least one carboxylic or sulfonic acid group directly or indirectly attached to said benzimidazole compound.

15 Claims, No Drawings

COMPOSITION AND PROCESS FOR TREATMENT OF METALLIC SURFACES

FIELD OF THE INVENTION

The present invention relates to a process for the treatment of metallic surfaces for the protection of the surface from oxidation and for enhancing its solderability. The treatment proposed chemically forms a protective layer on the metal surfaces which layer is exceptionally resistant to high temperature. This treatment is particularly useful as a preflux for copper circuitry prior to soldering.

BACKGROUND OF THE INVENTION

The chemical protection of copper and its alloys from oxidation is well known in the art. The use of various triazoles and imidazoles as anti-oxidants has been known for some time. In fact Benzotriazol is known and has provided excellent anti-oxidation properties for copper and its alloys. These and other anti-oxidants have proved successful as long as the protected surface is not heated.

With the rise of surface mount technology (SMT) in printed circuits boards, the anti-oxidants of the prior art have proven deficient at the high temperatures involved in the soldering operations. Anti-oxidants (or prefluxes) which also protect solderability at elevated temperatures have therefore been sought to fill this need. Therefore, the need to provide a preflux which is easily applied and stable at high temperatures, and thus protects the solderability of copper circuitry is clear.

Several advances have been made in this area utilizing alkyl-Benzimidazoles. U.S. Pat. No. 4,395,294 reveals the use of 5-methyl Benzimidazole. Although this is an improvement on the use of Benzotriazole, 5-methyl Benzimidazole forms only a very thin protective layer on the copper surfaces and thus its anti-corrosion and solderability properties at high temperatures are insufficient to meet today's needs.

The leading technology in this area today is taught in recently issued U.S. Pat. No. 5,173,130. This patent teaches the use of a benzimidazole compound having an alkyl group of at least 3 carbon atoms at the 2-position in conjunction with an organic acid. The materials taught in this, the Kinoshita, patent are greatly improved over the prior art. Kinoshita provides tier improved thermal resistance through the provision of a benzimidazole with a long alkyl chain in the 2-position. The long alkyl chain which Kinoshita stresses as necessary for good thermal resistance causes other problems. The long alkyl chain is also very hydrophobic and therefore can cause the compounds taught by Kinoshita to have very limited aqueous solubility. This low solubility may then cause precipitation of the Kinoshita compounds in aqueous solution as the solution is used. This solution instability obviously causes problems in production, consistency and life.

Thus the need still exists for a pre-flux, anti-oxidant, which possesses excellent thermal resistance and which has good water solubility.

SUMMARY OF THE INVENTION

This invention has answered the need for a pre-flux, antioxidant, which has both excellent thermal resistance and which has good solubility in aqueous solutions. It has been discovered that a benzimidazole having a carboxylic acid group or a sulfonic acid group attached to it possesses significantly greater aqueous solubility and therefore superior performance.

The carboxylic or sulfonic acid group may be attached to any appropriate position on the benzimidazole or even onto alkyl or aryl groups which are themselves attached appropriately to the benzimidazole. It is more preferable for the carboxylic or sulfonic acid groups to be attached directly to the benzimidazole and it is most preferable for said carboxylic or sulfonic acid groups to be attached directly to the aryl ring of the benzimidazole.

Although, compounds of this invention possess superior solubility in aqueous solutions with neutral to slightly alkaline pH's, they also provide solubility and stability benefits at acid pH's. The most preferable pH range is from 7 to 11. This differs significantly from the prior an benzimidazole solutions which require an acid environment for even slight solubility. These prior art benzimidazoles are thus plagued with insolubility problems which are salved with this invention. This invention thus offers stabilized neutral to alkaline solutions of these various benzimidazoles which can out perform those of the prior art.

DETAILED DESCRIPTION OF THE INVENTION

Typical compounds used in carrying out the process of the present invention are compounds represented by the following general formula:

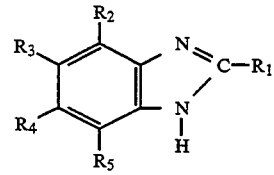

wherein at least 1 the constituents $R_1$, $R_2$, $R_3$, $R_4$ and $R_5$ must be selected from the group consisting of carboxylic acid groups, sulfonic acid groups, alkyl groups substituted with carboxylic or sulfonic acid groups and aryl groups substituted with carboxylic or sulfonic acid groups.

The more preferred embodiment of this invention requires at least 1 of the group of $R_2$, $R_3$, $R_4$ and $R_5$ be selected from the group consisting of carboxylic acid groups, sulfonic acid groups, alkyl groups substituted with carboxylic or sulfonic acid groups and aryl groups substituted with carboxylic or sulfonic acid groups.

The most preferred embodiment of this invention requires at least 1 of the group of $R_2$, $R_3$, $R_4$ and $R_5$ be selected from the group consisting of carboxylic acid groups and sulfonic acid groups.

Compounds of this invention thus possess superior solubility in aqueous solutions with slightly alkaline pH's. The most preferable pH range for the operation of this invention is from 7 to 11. This differs significantly from the prior an benzimidazole solutions which required an acid environment for even slight solubility.

These prior art acidic benzimidazole solutions are troubled by solubility problems. Initially these benzimidazole compounds are sparingly soluble in acid solution. As these acid solutions were operated, however, in treating copper and copper alloys, the benzimidazole began to precipitate from the solution, resulting in and unusable 2 phase mixture. These prior an solutions required pre-mature changing due to the low solubility of the benzimidazole compounds.

In addition, the acid balance in the prior art solution is critical. Too much or too little acid in the solution causes solution instability and/or poor performance. The treatment solutions of this invention circumvent these problems and provide performance across a wide operating window.

The present invention directly addresses these solubility problems without interfering with the improvements made in the prior art. Thus the present invention contemplates the addition of carboxylic or sulfonic acid groups to benzimidazoles as a solution to the solubility problems. This addition changes the solubility nature or the benzimidazole compounds. As indicated the benzimidazoles of the prior an are slightly soluble in acid solutions and completely insoluble in alkaline whereas the benzimidazole compounds of this invention achieve significant solubility at neutral to slightly alkaline pH's. In addition, this solubility is retained after use of the bath.

Thus, this increased solubility provides for longer bath life and ease of operation. This in turn establishes a bath which is more economical and consistent than the prior art.

As indicated previously, although the carboxylic and sulfonic acid groups can be attached directly or indirectly to any appropriate position on the benzimidazole, the most preferred compound has the carboxylic or sulfonic acid groups attached directly to the aryl ring of the benzimidazole. Thus this invention can utilize the teachings of Kinoshita by also have a long substituted or unsubstituted alkyl claim at the 2-position of the benzimidazole. As such, without limitation, one of the preferred compounds of the present invention has the following formula:

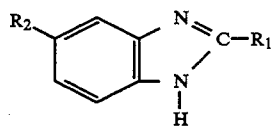

wherein $R_1$ is a long chain substituted or unsubstituted alkyl group or a substituted or unsubstituted aryl group and wherein $R_2$ is selected from the group consisting of COOH and $SO_3H$.

The above indicated compound thus possesses the thermal properties associated with the Kinoshita teachings and in addition is significantly more soluble in aqueous solution. Thus one facet of this invention retains the improvement of the prior art while addressing its shortcomings in regard to solubility.

Alkaline solutions of the compounds of the invention are preferable since these compounds are most soluble in a moderately alkaline environment. Most sources of alkalinity are useful in adjusting the pH of these baths including without limitation, sodium and potassium hydroxides, carbonates and the like. The amount of the alkalinity source should be sufficient to adjust and maintain the bath in the pH range of 7 to 11.

The compounds of the present invention arc added to the aqueous solution at a concentration in the range of 0.5 to 50 grams per liter, and preferably in the range of 5 to 15 grams per liter. The bath is then utilized at a temperature of ambient to 180° F. and preferable from 100° to 150° F. to treat copper and copper alloy surfaces.

In carrying out the present invention, the surface of the copper or copper alloy is first cleaned and possibly etched. Subsequently it is treated by immersion in the solution of this invention or by spraying or coating such solution onto the surface of the part.

The invention is further described in the following examples which are given for illustrative purposes only and are in no way limiting. All examples used the same pretreatment cycle:

| | |
|---|---|
| Alkaline Soak Cleaner | 5 minutes, 165° F. |
| Rinse | 2 minutes, Room Temp. |
| Sodium Persulfate/Sulfuric Acid Microetch | 1 minute, 92° F. |
| Rinse | 2 minutes, Room Temp. |
| Organic Preflux Coating | 1 minute, 110° F. |
| Rinse (Optional) | 2 minutes, Room Temp. |
| Dry | |

This pretreatment cycle was maintained constant throughout the examples except that the composition of the Organic Preflux Coating was varied in each example.

EXAMPLE I (CONTROL)

Several printed circuit boards with copper circuit,s, pads, and holes were processed through the standard pretreatment cycle noted previously except that the organic preflux coating step was excluded.

The boards were then exposed to the ambient atmosphere for approximately seven days. When examined after this exposure the copper circuits, pads and holes were tarnished. The boards were then treated with a soldering flux and floated in molten solder for ten seconds. Alter cooling the boards were examined tier solder coverage on the circuits, pads and holes. This examination revealed that the solder coverage of the copper was poor with a significant proportion of the copper surfaces uncoated with solder.

EXAMPLE II

Several printed circuit boards with copper circuits, pads and holes were processed through the standard pretreatment cycle noted previously. The organic preflux solution had the following composition:

| | % by weight |
|---|---|
| 2-nonyl Benzimidazole | 0.4 |
| Formic Acid | 4.1 |
| water | 95.5 |
| pH adjusted to 2.2 | |

The boards were then exposed to the ambient atmosphere approximately seven days. When examined after this exposure the copper circuits, pads and holes were clean and untarnished. The boards were then treated with a soldering flux and floated in molten solder for ten seconds. Alter cooling the boards were examined for solder coverage on the circuits, pads and holes. This examination revealed that the solder coverage of the copper was excellent with 100% solder coverage of all circuits, pads and holes.

The same organic preflux solution above was then used to process numerous circuit boards. After processing a number of boards the solution exhibited instability and began to precipitate. Boards processed after precipitation produced poor results in solderability after atmospheric exposure as above.

EXAMPLE III

Several printed circuit boards with copper circuits, pads and holes were processed through the standard pretreatment cycle noted previously. The organic preflux solution had the following composition:

|  | % by weight |
| --- | --- |
| 2-Benzyl - 5-Carboxyl Benzimidazole | 1.0 |
| water | 99.0 |
| NaOH to pH of 8.0 | |

The boards were then exposed to the ambient atmosphere for approximately seven days. When examined after this exposure the copper circuits, pads and holes were clean and untarnished. The boards were then treated with a soldering flux and floated in molten solder for ten seconds. After cooling the boards were examined for solder coverage on the circuits, pads and holes. This examination revealed that the solder coverage of the copper was excellent with 100% solder coverage of all circuits, pads and holes.

The same organic preflux solution above was then used to process numerous circuit boards. This solution exhibited no instability or precipitation even after a great many boards were processed. The solution's antitarnish and solderability performance remained excellent throughout the testing.

EXAMPLE IV

Several printed circuit boards with copper circuits, pads and holes were processed through the standard pretreatment cycle noted previously. The organic preflux solution had the following composition:

|  | % by weight |
| --- | --- |
| 2-nonyl - 7-Carboxyl Benzimidazole | 1.0 |
| water | 99.0 |
| NaOH to pH of 8.0 | |

The boards were then exposed to the ambient atmosphere for approximately seven days. When examined after this exposure the copper circuits, pads and holes were clean and untarnished. The boards were then treated with a soldering flux and floated in molten solder for ten seconds. After cooling the boards were examined for solder coverage on the circuits, pads and holes. This examination revealed that the solder coverage of the copper was excellent with 100% solder coverage of all circuits, pads and holes.

The same organic preflux solution above was then used to process numerous circuit boards. This solution exhibited no instability or precipitation even after a great many boards were processed. The solution's antitarnish and solderability performance remained excellent throughout the testing.

EXAMPLE V

Several printed circuit boards with nickel plated circuits, pads and holes were processed through the standard pretreatment cycle noted previously. The organic preflux solution had the following composition:

|  | % by weight |
| --- | --- |
| 2-nonyl - 7-Carboxyl Benzimidazole | 1.0 |
| water | 99.0 |
| NaOH to pH of 8.0 | |

The boards were then exposed to the ambient atmosphere for approximately seven days. When examined after this exposure the nickel circuits, pads and holes were clean and untarnished. The boards were then treated with a soldering flux and floated in molten solder for ten seconds. After cooling, the boards were examined for solder coverage on the circuits, pads and holes. This examination revealed that the solder coverage of the nickel was excellent with 100% solder coverage of all circuits, pads and holes.

The same organic preflux solution was then used to process numerous circuit boards. This solution exhibited no instability or precipitation even after a great many boards were processed. The solution's antitarnish and solderability performance remained excellent throughout the testing.

I claim:

1. A process for chemically forming a protective layer on a metallic surface which process comprises treating the metallic surface with an aqueous solution comprising a benzimidazole compound which benzimidazole compound has the formula:

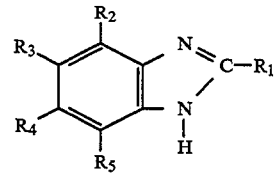

wherein at least 1 of the constituents, $R_1$, $R_2$, $R_3$, $R_4$ and $R_5$ are selected from the group consisting of carboxylic acid groups, sulfonic acid groups, alkyl groups substituted with carboxylic or sulfonic acid groups and aryl groups substituted with carboxylic or sulfonic acid groups; and wherein the remaining constituents of $R_1$, $R_2$, $R_3$, $R_4$ and $R_5$ are selected from the group consisting of hydrogen, halogen, substituted or unsubstituted alkyl groups and substituted or unsubstituted aryl groups.

2. A process according to claim 1 wherein at least 1 of the constituents, $R_2$, $R_3$, $R_4$ and $R_5$ are selected from the group consisting of carboxylic acid groups, sulfonic acid groups, alkyl groups substituted with carboxylic or sulfonic acid groups and aryl groups substituted with carboxylic or sulfonic acid groups; and wherein the remaining constituents of $R_1$, $R_2$, $R_3$, $R_4$ and $R_5$ are selected from the group consisting of hydrogen, halogen, substituted or unsubstituted alkyl groups and substituted or unsubstituted aryl groups.

3. A process according to claim 1 wherein at least 1 of the constituents $R_2$, $R_3$, $R_4$ and $R_5$ are selected from the group consisting of a carboxylic acid group and sulfonic acid group; and wherein the remaining constituents of $R_1$, $R_2$, $R_3$, $R_4$ and $R_5$ are selected from group consisting of hydrogen, halogen, substituted or unsubstituted alkyl groups and substituted or unsubstituted aryl groups.

4. A process according to claim 1 wherein said aqueous solution is adjusted to a pH in the range of 7 to 11 with a source of alkalinity.

5. A process according to claim 1 wherein the protective layer is sufficient to protect the solderability of the metallic surface.

6. A process according to claim 1 wherein the metallic surface comprises copper or a copper alloy.

7. A process according to claim 2 wherein the metallic surface comprises copper or a copper alloy.

8. A process according to claim 2 wherein said aqueous solution is adjusted to a pH in the range of 7 to 11 with a source of alkalinity.

9. A process according to claim 2 wherein the protective layer is sufficient to protect the solderability of the metallic surface.

10. A process according to claim 3 wherein said aqueous solution is adjusted to a pH in the range of 7 to 11 with a source of alkalinity.

11. A process according to claim 3 wherein the protective layer is sufficient to protect the solderability of the metallic surface.

12. A process accordking to claim 3 wherein teh metallic surface comprises copper or a copper alloy.

13. A process according to claim 5 wherein the metallic surface comprises copper or a copper alloy.

14. A process according to claim 9 wherein the metallic surface comprises copper or a copper alloy.

15. A process according to claim 11 wherein the metallic surface comprises copper or a copper alloy.

* * * * *